United States Patent
Mallinson

(10) Patent No.: US 11,258,453 B2
(45) Date of Patent: Feb. 22, 2022

(54) ANALOG TO DIGITAL CONVERTER

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

(*) Notice: Subject to any disclaimer, the term of this patent is extended or adjusted under 35 U.S.C. 154(b) by 0 days.

(21) Appl. No.: 17/195,450

(22) Filed: Mar. 8, 2021

(65) Prior Publication Data
US 2021/0281273 A1    Sep. 9, 2021

Related U.S. Application Data

(60) Provisional application No. 62/987,085, filed on Mar. 9, 2020.

(51) Int. Cl.
| | |
|---|---|
| *H03M 1/38* | (2006.01) |
| *H03M 1/16* | (2006.01) |
| *H03M 1/12* | (2006.01) |
| *H03M 1/34* | (2006.01) |

(52) U.S. Cl.
CPC ......... *H03M 1/164* (2013.01); *H03M 1/1245* (2013.01); *H03M 1/34* (2013.01)

(58) Field of Classification Search
CPC ...... H03M 1/164; H03M 1/1245; H03M 1/34; H03M 1/44; H03M 1/00
USPC ....................................................... 341/161
See application file for complete search history.

(56) References Cited

U.S. PATENT DOCUMENTS

| | | | | | |
|---|---|---|---|---|---|
| 4,053,846 | A | * | 10/1977 | Acker | H03G 1/0052 330/279 |
| 4,186,384 | A | * | 1/1980 | Acker | H04L 25/03038 341/143 |
| 4,242,730 | A | * | 12/1980 | Golias | G01N 21/5907 346/33 A |
| 5,206,648 | A | * | 4/1993 | Yukawa | H03M 3/352 341/143 |
| 5,323,159 | A | * | 6/1994 | Imamura | H03M 1/68 341/127 |
| 9,013,344 | B2 | * | 4/2015 | El-Chammas | H03F 1/0272 341/155 |

(Continued)

OTHER PUBLICATIONS

Theresa Corrigan, "How to Calculate the Settling Time and Sampling Rate of a Multiplexor," Analog Devices AN-1024 Application Note, 2009, pp. 1-4, US.

*Primary Examiner* — Jean B Jeanglaude
(74) *Attorney, Agent, or Firm* — Gard & Kaslow LLP

(57) ABSTRACT

A pipelined ADC that does not wait for the residue of a signal to settle to be delivered to the next stage of the pipeline, and thus passes signals to subsequent stages at faster than conventional speeds. A pipelined ADC is used that processes signals representing the boundaries of the search space. Thus, each stage does not necessarily receive the signal as pre-processed by the prior stage, but rather the search space boundaries as pre-processed by the prior stage. Reducing the "search space" of the ADC is equivalent to creating the residues in each step of a pipeline as in the prior art. An ADC operating in this fashion operates without error even if the residual search space boundary outputs from one state are presented to the next stage before the outputs have settled, and can run faster for a given power and bandwidth.

13 Claims, 10 Drawing Sheets

900

(56) References Cited

U.S. PATENT DOCUMENTS

| | | |
|---|---|---|
| 10,103,742 B1 | 10/2018 | Guo et al. |
| 2005/0068219 A1* | 3/2005 | Kobayashi .............. H03M 1/06 |
| | | 341/161 |
| 2006/0114141 A1 | 6/2006 | Nandi et al. |
| 2009/0231174 A1 | 9/2009 | Sutardja |
| 2014/0347204 A1* | 11/2014 | El-Chammas .......... H03F 3/211 |
| | | 341/155 |
| 2018/0205389 A1 | 7/2018 | Chen et al. |
| 2019/0013816 A1 | 1/2019 | Shrivastava et al. |
| 2019/0103879 A1 | 4/2019 | Kinyua |

* cited by examiner

ANALOG TO DIGITAL CONVERTER

This application claims priority from Provisional Application No. 62/987,085, filed Mar. 9, 2020, which is incorporated by reference herein in its entirety.

FIELD OF THE INVENTION

The present invention relates generally to signal processing circuits, and more particularly to analog to digital converters (ADCs).

BACKGROUND OF THE INVENTION

As is well known in the art, an analog to digital converter (ADC) converts an analog signal into a digital signal. For example, an ADC may convert an input analog voltage or current to a digital number representing the magnitude of the analog voltage or current. Thus, it is necessary for an ADC to be able to find the value of that input parameter.

In some instances, the value of an input parameter may be determined with sufficient resolution in a single step. In cases where the measurement means does not deliver sufficient resolution on one step, a well-known method of finding the value of the input parameter is known as successive approximation.

If the resulting digital number representing an input parameter is limited to a range of unit values from 0 to 255, then 8 binary bits are required to uniquely identify all possible values. If there is a measurement means that can yield 8 or more bits of information in one step, then successive approximation is not necessary. If, however the measurement means delivers fewer than the number of bits required to resolve the input parameter in the range of resulting digital numbers then successive approximation may be used.

For example, consider an example where the input parameter is a weight between 0 and 255 grams. If there is an available scale with a spring and pointer arrangement that will read up to 255 grams in 1 gram increments, then the weight of any item from 0 to 255 grams that is placed on the scale can be read out in one step to an accuracy of 1 gram by looking at the pointer position.

To understand successive approximation, consider instead a scale of the type where two pans are fixed to a single fulcrum. The object to be weighed is placed in a first pan and one or more weights are placed in the second pan. In the case above of a weight between 0 and 255 grams, binarily arranged weights of, for example, 128 grams, 64 grams, 32 grams, 16 grams, 8 grams, 4 grams, 2 grams and 1 gram are available to be placed on the second pan.

In a process, one might first place the 128 gram weight on the second pan; the 128 grams may, or may not, exceed the weight of the object on the first pan. If the weight of the object is greater than 128 grams, then the 64 gram weight is added to the second pan. If, on the other hand, the weight of the object is initially less than 128 grams, then the 128 gram weight is removed from the second pan and the 64 gram weight is added to the second pan.

If the weight of the object still exceeds the weight(s) in the second pan, then the 32 gram weight is added to the second pan. On the other hand, if the weight of the object is less than the weight(s) in the second pan, then the 64 gram weight is removed from the second pan and the 32 gram weight is added to the second pan. This process of adding successively smaller weights while either keeping or removing the previously added weight is continued until balance is achieved. The total of the weights in the second pan is then the weight of the object.

By repeatedly determining whether the weight of the object is greater or less than that of the weight(s) in the second pan, and then adding the next smaller weight while either leaving or removing the last added weight, the pans will eventually balance. At the end of this process a certain number of the weights remain on the second pan which, when added together, equal the weight of the object.

Note that in both cases of the spring and pointer scale and the scale with binarily weighted weights the resulting measurement is to one part in 256. In the spring and pointer case, the pointer position on the scale is able to deliver all eight bits of information required to determine one part in 256 in one measurement. In the other case, the binary weight scale results in a single bit of information per step, i.e., is the total of weights in the second pan greater than the weight of the object in the first pan or not.

These examples serve to show that making a measurement may be done "in a flash," i.e., in one step, or may require successive approximations. In electronic devices instances that are equivalent to the spring and pointer scale, where only a single measurement step is needed, are indeed called "flash convertors," while instances in which successive approximation is used are called Successive Approximation Register ("SAR") devices, as storage of each single measurement step in such registers is a necessary part of the process and SAR device.

In some instances, successive approximation may be used even when more than one bit of information is derived in each measurement step: if the weigh scale had a means to report "greater than the weight applied but not greater than 2× the weight applied" or "less than the weight applied but not less than ½ the weight applied," etc., the user/process could omit the application of certain weights, as it would already be known that adding a particular weight would make no difference. The extra information of "not greater than 2×" or "not less than ½" means more than one bit of information per measurement and this has been exploited in some products.

Some available SAR convertors "pipeline" successive approximation steps. Pipelining is a well-known technique in signal processing and computer architecture, in which multiple steps or instructions are overlapped in execution.

For example, in the scale example above, the process requires a repeated use of the same scale; in fact, eight steps are needed to determine the weight of the object to within 1 gram of a possible 255 gram range. As above, first the comparison to 128 grams is made; depending on the single result that weight is removed or not, and the 64 gram weight is added, etc.

Pipelining provides a different and advantageous alternative using eight weigh scales operating in sequence. The first scale always compares the unknown object weight to the 128 grams weight, and passes to the next scale a replica of the object and the information that it exceeds, or does not exceed, 128 grams. The second scale then compares the object to 192 grams or 64 grams, i.e., 192 grams if the first scale reported greater than 128 grams, or 64 grams if the first scale reported less than 128 grams.

A further improvement used in almost all pipelined ADCs is to pass on the "residue" of the signal rather than the signal itself. In the example of the scale above, the first scale, passes a replica of the object to the next stage of the pipeline, i.e., to the second scale, along with the information as to whether or not the 128 grams used by the first scale was exceeded. The second stage then uses the information from the first scale, i.e., the bit from the prior state, to determine whether or not to place the 128 gram weight on the scale with the 64 gram weight.

If, however, the first stage could pass on the residual weight of the object after 128 grams is removed from the object, then the second (and succeeding stages) need not use the previously derived bits, but rather need only apply their local weights to whatever object they receive, record whether it is higher or lower then the local weight and pass on a replica of the object received or an object weighting the same as the object received minus the local weight. While this may be difficult with objects, it is easy with signals.

The advantage of such a pipeline is that the first scale can be working on the next object to be weighted while the next scale is working on the previous object. Once the pipeline is filled, eight scales will allows all eight bits of a measurement to be delivered at the rate that one weigh scale can operate, so that a complete measurement is delivered from the eighth and last scale at the same rate objects are placed on the first scale.

Almost all fast ADCs use such a methodology; they are pipelined, extract one or more bits from the signal at each stage, and pass on a residue of the signal to the next stage.

The residue passed on to the next stage must accurately reflect the signal minus the local weight. If the overall ADC is to be accurate to 12 bits, the residue of the first stage in the pipeline, after extracting one bit, must be accurate to 11 bits, the residue of the second state accurate to 10 bits, and so forth. Passing the residue to the next stage must also be fast, as the system must wait until the residue is successfully replicated at the input to the next stage before moving on to the next sample. (If more bits are extracted per stage, for example, two bits per stage, then in the 12 bit case the residue must be accurate to 10 bits and so forth.)

SUMMARY OF THE INVENTION

Described herein is an apparatus and method for a fast ADC that is able to pass signals to subsequent stages of a pipeline at faster than conventional speeds.

One embodiment describes a method of converting an input sample of an analog signal to a digital value, comprising: receiving, by a circuit, the input sample of an analog signal; determining, by the circuit, that a value based upon the input sample is either greater than or equal to, or less than, a fraction of the sum of a high level and a low level and generating a bit of 1 or 0 if the value based upon the input sample is greater than or equal to the fraction of the sum of the high level plus the low level or an opposite bit of 0 or 1 if the value based upon the input sample is less than the fraction of the sum of the high level and the low level; resetting, by the circuit, the low level to the fraction of the sum of the high level plus the low level without altering the high level if the value based upon the input sample is greater than or equal to the fraction of the sum of the high level and the low level; resetting, by the circuit, the high level to the fraction of the sum of the high level plus the low level without altering the low level if the value based upon of the input sample is less than the fraction of the sum of the high level plus the low level; and repeating the steps of comparing the value based upon the input sample to the fraction of the high level plus the low level and resetting the high or low level and attaching additional bits generated by each comparing step to bits previously generated until a number of bits corresponding to a desired accuracy of the digital value have been generated.

Another embodiment describes a circuit for use as a stage in an analog to digital converter, comprising: a comparator configured to compare an input sample of an analog signal, to a fraction of the sum of high level and a low level, and to generate a bit of 1 or 0 if the input sample is greater than or equal to the fraction of the sum of high level and the low level or an opposite hit of 0 or 1 if the input sample is less than the fraction of the sum of the high level and the low level; a first amplifier circuit configured to output as the low level the fraction of the sum of the high level plus the low level without altering the high level if the value of the input sample is greater than or equal to the fraction of the sum of the high level and the low level; and a second amplifier circuit configured to output as the high level the fraction of the sum of the high level plus the low level without altering the low level if the value of the input sample is less than the fraction of the sum of the high level plus the to level.

Still another embodiment describes a non-transitory computer readable storage medium having embodied thereon instructions for causing a computing device to execute a method of converting an input sample of an analog signal to a digital value, the method comprising: receiving, by a processor, the input sample of an analog signal; determining, by the processor, that the input sample is either greater than or equal to, or less than, a fraction of the sum of a high level and a low level and generating a bit of 1 or 0 if the input sample is greater than or equal to the fraction of the sum of high level and the low level or an opposite bit of 0 or 1 if the input sample is less than the fraction of the sum of the high level and the low level; resetting, by the processor, the low level to the fraction of the sum of the high level plus the low level without altering the high level if the value of the input sample is greater than or equal to the fraction of the sum of the high level and the low level; resetting, by the processor, the high level to the fraction of the sum of the high level plus the low level without altering the low level if the value of the input sample is less than the fraction of the sum of the high level plus the low level; and repeating the steps of comparing the input sample to the fraction of the high level and low level of and resetting the high or low level and attaching additional bits generated by each comparing step to bits previously generated until a number of bits corresponding to a desired accuracy of the digital value have been generated.

DETAILED DESCRIPTION OF THE INVENTION

Described herein is an apparatus and method for a pipelined ADC that does not need to wait for the residue of a signal to settle to be accurately delivered to the next stage of the pipeline, and thus is able to pass signals to subsequent stages of a pipeline at faster than conventional speeds.

An ADC operates within its "search space," i.e., a range of possible output values, to find a digital value that represents an analog value. The technique of the present approach uses a pipelined ADC distinguished from the known art in that it processes signals representing the minimum and maximum possible digital values, or "boundaries," of the search space, rather than the analog signal itself. Thus, each pipeline stage does not necessarily receive the signal as pre-processed by the prior stage, but rather signals representing the search space boundaries as pre-processed by the prior state.

The search space boundary signals may both be in error by an arbitrary gain factor without affecting the result. Such an error occurs when the boundary signals are sampled before they have settled, but since both boundary signals are sampled too soon, each has an apparent gain error, and thus the error does not degrade the performance of the ADC.

Since the boundary signals can be passed from one stage to the next faster than an input signal that must settle, the ADC of the present approach can run faster for a given power and bandwidth. Since the gain factor is arbitrary, it need not be nominally one, but rather may advantageously be greater than one such that the signal levels in latter stages of the pipeline remain reasonably large so as to aid signal processing. Further, processing the search space boundaries does not prevent any of the known solutions for error correction or comparator offset error, grey coding, etc. from being used.

The present approach described herein utilizes the fact that reducing the search space of the ADC is equivalent to creating the residues in each step of a pipeline as in the known art. An ADC using this present approach operates without error even if the residual search space boundary outputs from one stage are presented to the next stage before the outputs have completely settled.

As a pipeline proceeds according to the known art, it is often thought that the process is one of manipulating the signal (removing the residue or not) and applying that manipulated signal to the next stage. The signal generated by the pipelined ADC is represented by the bits that are accumulated for each step (i.e., the "is the object weight greater than the local weight?" determination above) and the "residue reduced" signal at each stage.

Figure 1:
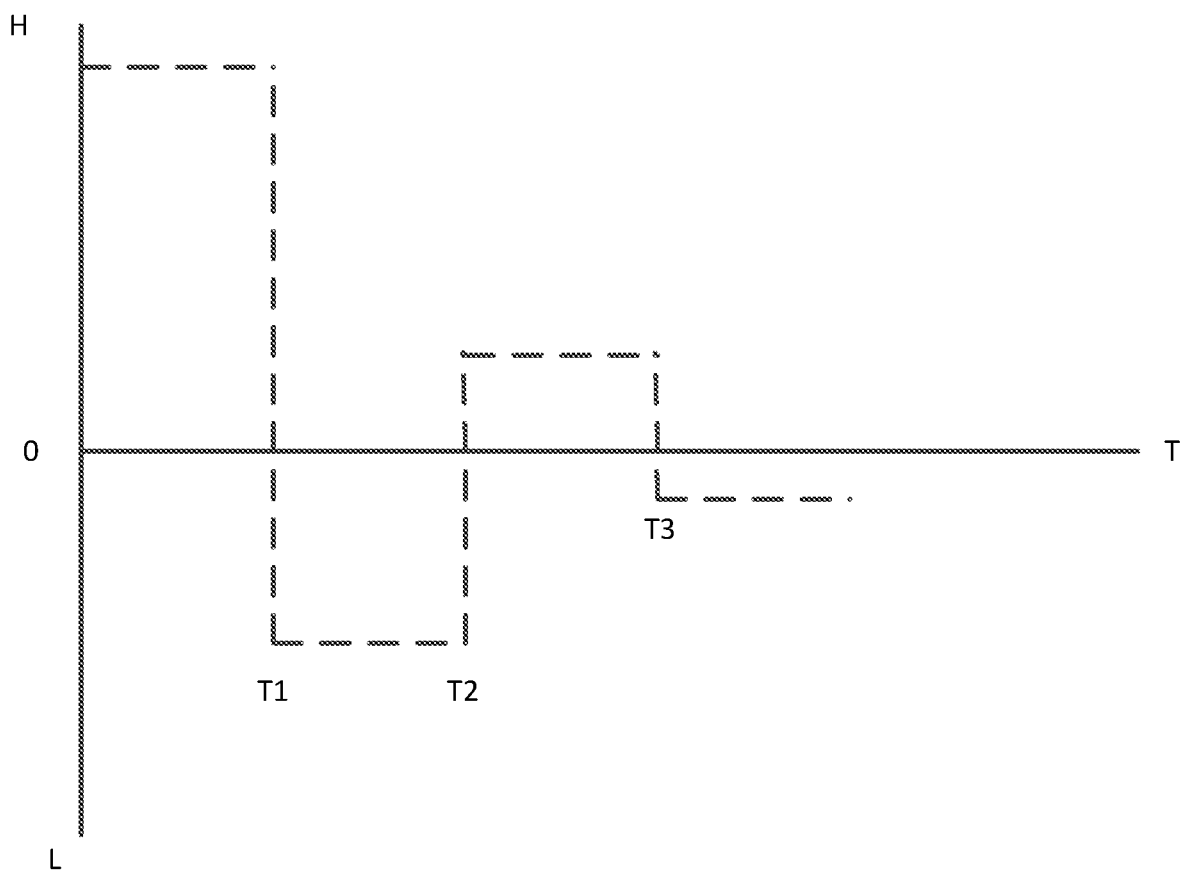
FIG. 1 is a graph showing how residual values might occur in an ADC pipeline.

FIG. 1 is a graph showing how residual values might occur in a conventional ADC pipeline using such a successive approximation process of the known art. At time 0, the signal S is received. A first stage compares S to a first reference value (such as 128 grams in the scale example above), and passes the residue of the signal to a second stage at a time T1. If the comparison in the first stage is to a value that is half of the maximum value, the value of the residue must by definition be less than half of the maximum value. In the second stage, the residue of the signal is compared to a second reference value that is half of the first reference value (such as 64 grams in the scale example), the residue of this comparison is passed to a third stage at a time T2. This continues until all of the stages have processed the signal, with the reference value going down by 50% in each stage; in the scale example, this would continue until the last weight of 1 gram is used.

As above, in a conventional DAC each stage creates one bit of the output, with the first stage providing the most significant bit and the last stage providing the least significant bit; the bits are then combined in order to produce the output. In the scale example, each scale similarly provides one bit of information, i.e., whether the particular weight being used on each scale is included in the final weight.

In FIG. 1, the residual values are shown inverting in sign at each stage for ease of displaying the diminishing value of the residual; in actual operation of an ADC, the signal could be at the maximum value of the range and each residual value would be positive so that all of the resulting bits are positive and the interim values of the output trend toward the maximum possible output.

Figure 2:
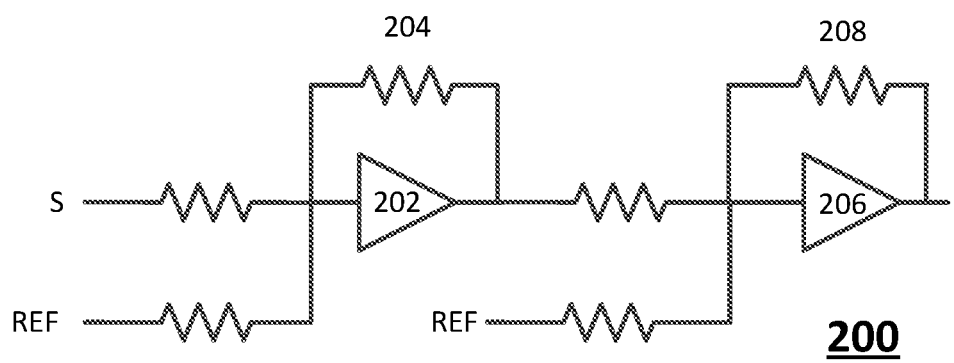
FIG. 2 shows a diagram of one implementation of a circuit comprising two successive stages of a pipeline.

FIG. 2 shows a diagram of one implementation of a circuit 200 comprising two successive stages of a pipeline as might be used in an ADC in the known art. An input signal S and a reference signal REF are applied together to a first stage that comprises an amplifier 202 and a feedback resistor 204. Depending upon how input signal S compares to reference signal REF (the comparator circuit is not shown), a "bit" of 0 or 1 is extracted, and REF is driven to one of two values for the next stage.

The output of amplifier 202 will be a residue of the original signal, after removal of the portion of the signal corresponding to that most significant bit; that residue is fed to the second stage of the circuit, which comprises another amplifier 206 and a feedback resistor 208. As many stages are used as are needed to obtain a desired number of bits of the output signal that corresponds to the desired accuracy, e.g., eight stages are needed to obtain accuracy to eight bits, or one part in 256.

Figure 3:
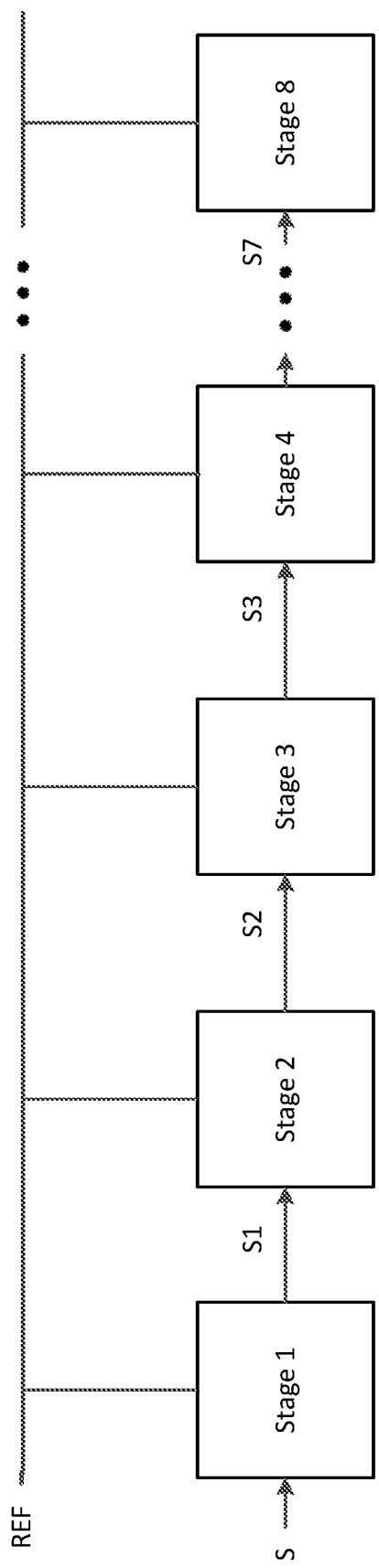
FIG. 3 is a block diagram of a pipeline that may be constructed from circuits such as that shown FIG. 2.

FIG. 3 is a block diagram of a pipelined ADC 300 that may be constructed from circuits such as circuit 200 of FIG. 2 according to the known art. As the signal S passes through the stages of the pipeline, it is broken down into residual signals S1, S2 and S3, etc. Each stage determines a bit of the output, with the first stage providing the most significant bit, the second stage providing the next most significant bit, etc. Pipeline 300 is illustrated as having eight stages, but, as is known in the art, a pipelined ADC may have any desired number of stages.

One limitation of pipelining in the known art is the timing of processing each signal or residue. As is known in the art, amplifiers such as those shown in FIG. 2 take a finite amount of time, the "time constant" or "RC constant" (resistance times capacitance) to settle at, or reach, their final value. Thus, each stage must wait for the output of the previous stage to settle at its output value to the desired accuracy.

Figure 4:
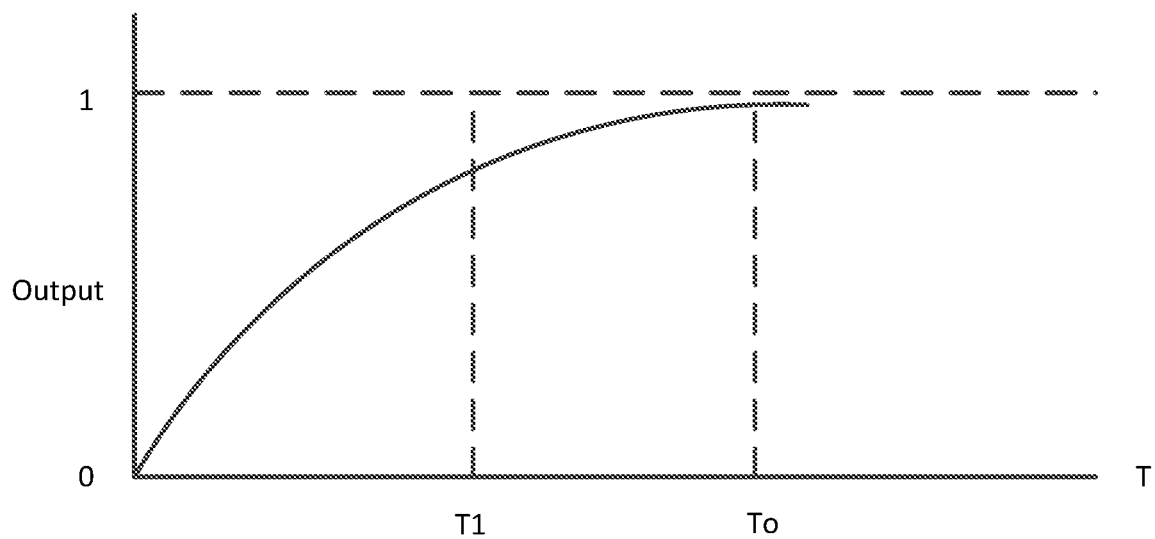
FIG. 4 is a graph of a typical output of an amplifier over time.

FIG. 4 is a graph of a typical output of an amplifier over time. It may be seen that, as is typical and as is known in the art, an amplifier asymptotically approaches its final output value over time, and given its time constant is considered to reach the final output value at a time T0. As above, in a conventional pipeline, such as pipeline 300 of FIG. 3, it is assumed that the amplifier in each stage is allowed to reach its full output value after a time T0 before the residual output from the stage is used by the next stage. If the output of a stage is sampled at an earlier time, such as time T1, the stage output will not have settled at its full final value.

It will be apparent that more accurate ADCs, i.e., those that provide an output signal having more bits and thus require more stages, take longer to reach their final output values. For example, a common amplifier with a bandwidth of 1 gigahertz (1 GHz) has a time constant of about 160 picoseconds (ps), and requires about seven time constants, or 1.1 nanoseconds (1.1 ns=1100 ps) to settle to 10 bits of accuracy.

Thus, a pipelined ADC with 1 GHz bandwidth will operate at about 1 GHz/1.1 ns or about 900 megahertz (MHz). If the time needed to wait for the output of each amplifier to settle could be shortened, an ADC could operate faster.

Suppose the value of the output signal of the amplifier in a first stage at time T1 is not yet settled at its final value, but is at 0.8 (i.e., 80%) of its full value; the difference between the value at time T0 and that at time T1 may be considered to be a "settling error." If it could be accurately predicted that the other stages will have the same settling error, the pipeline could be made to run faster by altering the reference signal REF to correspond, i.e., by also reducing REF to 0.8 of its value for use in the second stage. Each subsequent stage that similarly receives a signal at 0.8 of its full value from a prior stage would then utilize another similar reduction of reference signal REF.

Figure 5:
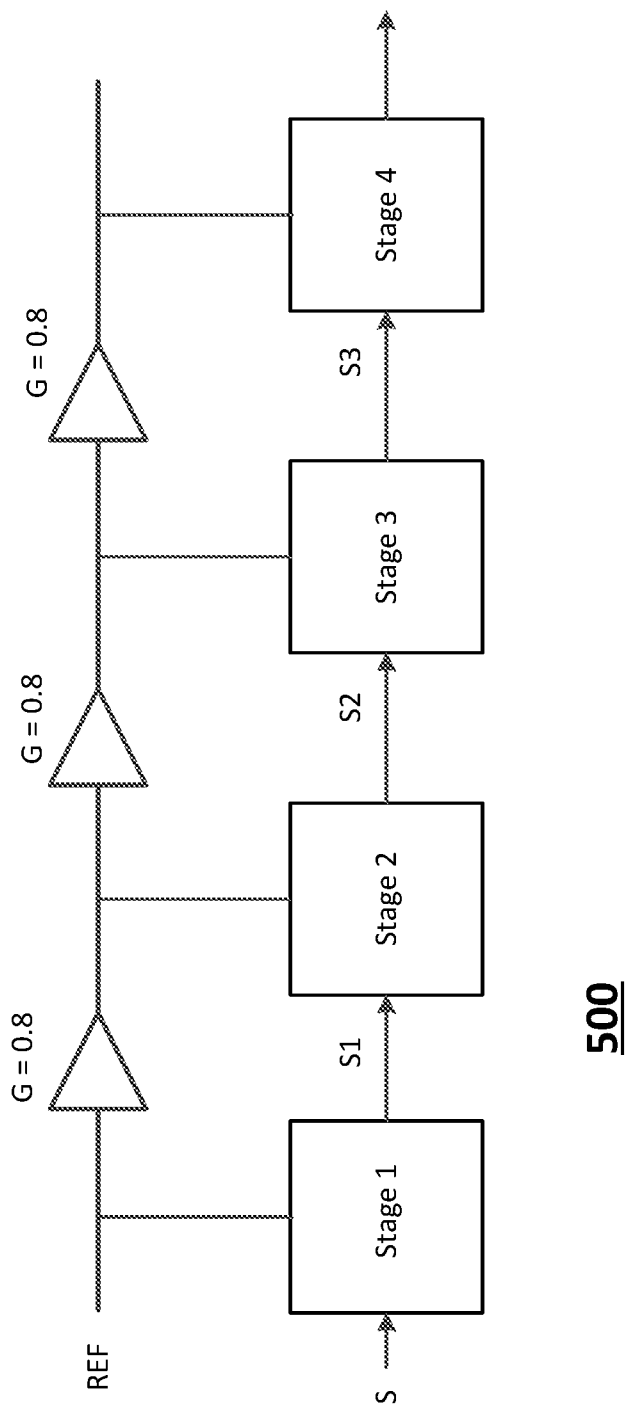
FIG. 5 is a block diagram of another pipeline that may be constructed from circuits such as that shown in FIG. 2.

FIG. 5 is a block diagram of a pipeline 500 that may be constructed from circuits such as circuit 200 of FIG. 2, in a similar fashion to pipeline 300 of FIG. 3, but passing the residual value from each stage to the next in a shorter time. As in pipeline 300, in pipeline 500 the signal S passes through the stages of the pipeline, it is broken down into residual signals S0, S1 and S2. Each stage determines a bit of the output, with the first stage providing the most significant bit, the second stage providing the next most significant bit, etc.

In pipeline 500 each residual signal is taken from the prior stage at a time T1 at which the output of the stage is 80% of its final value, rather than at time T0, and thus has a settling error. To compensate for the reduction in signal at each stage, the reference signal REF is also reduced to 80% of its prior value at each stage after the first stage as indicated by amplifiers in the REF signal line, each having a gain of 0.8.

Thus, the problem of the settling error can be corrected by reducing the value of the reference signal, i.e., by imposing a gain of less than one on the reference signal that corresponds to the magnitude of the settling error. However, one consideration with this approach is that it may be difficult to accurately determine the settling error. The time constant of an amplifier can vary both with temperature and the frequency of the signal being processed, as well as other factors. Further, the speed improvement is only the difference in time between T0 and T1, probably less than 50%, times the number of stages so that the overall speed improvement is similarly less than 50%.

The approach described herein provides a significant improvement over both the prior art and the suggestion above that residue signals can be accessed before they have settled.

The present approach, rather than comparing the input signal, and later its residues, to a reference signal that declines by 50% in each subsequent stage, instead compares the boundaries of the search space to the input signal, and modifies the boundaries depending upon their relation to the input signal.

In this approach, two analog signals H and L respectively represent the upper and lower boundaries of the search space. The input signal S is compared to the midpoint of H and L, which is a value (H+L)/2. If the input signal is below the midpoint (H+L)/2, then the upper boundary H is moved lower and redefined to be (H+L)/2, while lower boundary L does not change.

On the other hand, if the input signal is greater than or equal to the midpoint (H+L)/2, then upper boundary H does not change, while lower boundary L is moved higher and redefined to be (H+L)/2. The movement of either H or L in each stage generates a next bit of the overall digital output of the ADC. Movement of H generates a bit of 1, while movement of L generates a bit of 0.

One of skill in the art will appreciate that in some cases there will be samples of the input signal that will be near the midpoint of H and L, and that it may thus be difficult to determine whether the input sample is greater than or equal to, or less than, (H+L)/2. Reducing or eliminating the need to be so precise in the comparison operation is commonly known as error correction, and is discussed further below.

Figure 6:
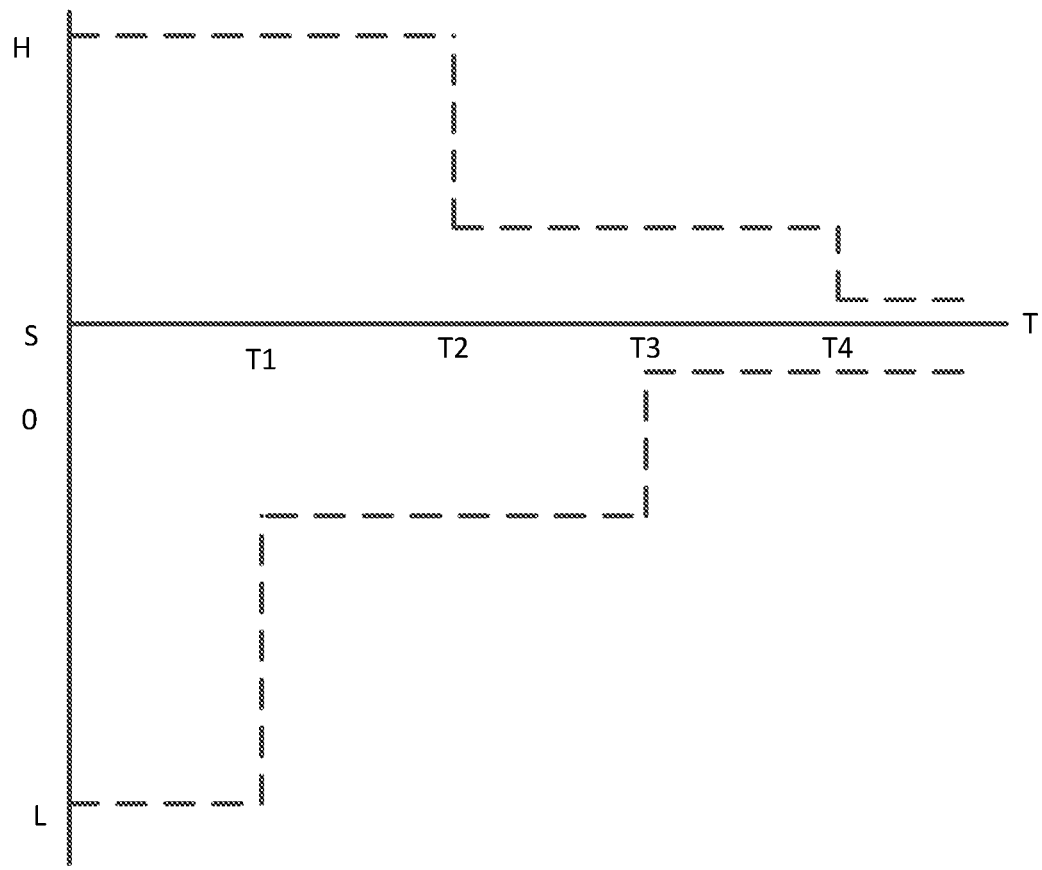
FIG. 6 is a graph showing how the boundary values of a search space may change according to one embodiment.

FIG. 6 is a graph showing how the boundary values of a search space may change according to one embodiment and one example. Initially upper boundary H and lower boundary L are equally distant from 0. Signal S is compared to the midpoint of H and L, (H+L)/2, which is currently 0, and is found to be greater than 0. The lower boundary L is then redefined to be (H+L)/2, which again is 0. The next stage compares S to the new midpoint of H and L, (H+L)/2; as L is currently 0, this means S is compared to H/2. As shown in FIG. 6, S is less than (H+L)/2, so now the upper boundary H is redefined to be (H+L)/2 at T2. As each stage compares S to (H+L)/2, either the upper boundary H or lower boundary L will move closer to S until H and L converge at S.

In one embodiment, rather than having an upper boundary H and lower boundary L defined independent of S, H and L are assumed to each be a distance from S that is half of the total range. The upper boundary H and lower boundary L are thus defined such that:

$$H = S + R$$

and $$L = S - R$$

where R is half of the total range.

From these equations it follows that initially:

$$S = \frac{H + L}{2}$$

and $$R = \frac{H - L}{2}$$

Now the pipeline can be run as if the actual input signal is 0, and the signals H and L are now the signals processed down the pipeline, replacing the original input signal S and its residues. Again, each stage generates a bit of 1 or 0 depending on whether the value of upper boundary H or lower boundary L is changed.

In each stage, the midpoint of H and L is again compared to the "input signal" which is now 0, and one or the other of H or L adjusted at each stage. The process limits the range of where each additional bit can be, i.e. the significance of each additional bit, so that the search space decreases as both H and L approach 0, resulting in a gain of 50% in each stage.

Figure 7:
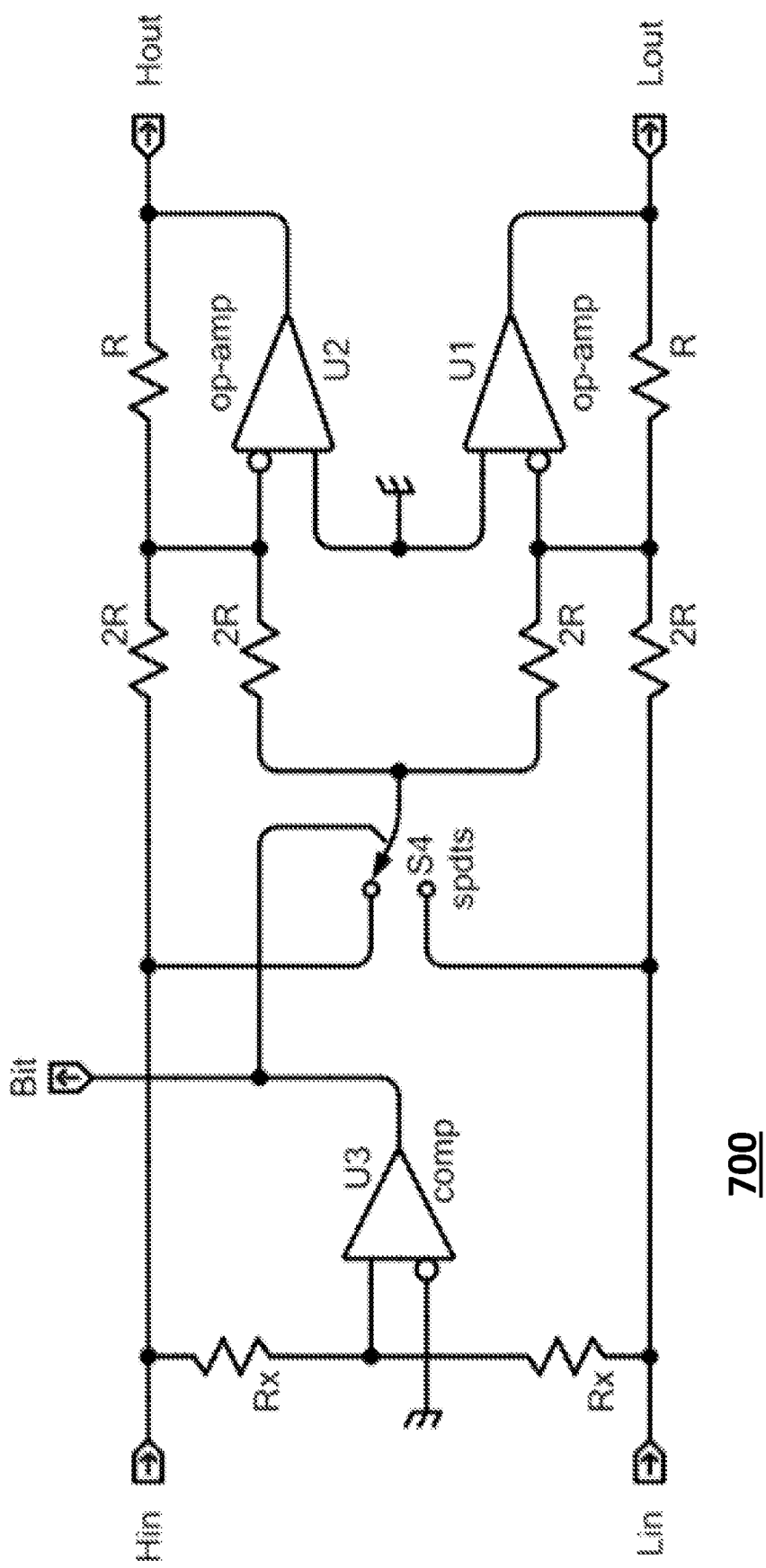
FIG. 7 is a diagram of one embodiment of a stage that may be used in a pipeline in the described method.

FIG. 7 is a diagram of one embodiment of a stage 700 that may be used in a pipeline in the described method and according to the present approach. A comparator U3 receives at its non-inverting input the value (H+L)/2, created by passing the input values of H and L, Hin and Lin, through two resistors of equal value Rx. As above, the input signal has been reset to 0, so comparator U3 compares (H+L)/2 to 0 volts, and outputs a bit here called "Bit." If 0 is greater than or equal to (H+L)/2, the value of Bit will be low or 0 and switch S4 will be in the position shown in FIG. 7, and will pass Hin to Hout nominally unmodified (other than a change of sign, the gain of U2 being minus one) and pass Lin to Lout, modifying the value of Lout to be (Lin+Hin)/−2 (the gain of U1 being minus ½ from each of Hin and Lin) to the remainder of circuit 700. Conversely, if 0 is less than (H+L)/2, the value of Bit will be high or 1 and switch S4 will be in the opposite position to that shown in FIG. 7, and will pass Lin to Lout nominally unmodified and modify the value of Hout to be (Lin+Hin)/2, and pass those values to the remainder of circuit 700. This generates the first bit of the output of the ADC.

Note that the gains of both U2 and U1 are negative, and thus when Hin or Hout is said to pass "nominally unmodified," this ignores the change of sign. Use of the convenient and well-known virtual ground amplifier (the configuration of U2 and U1 in FIG. 7) in this embodiment results in an alternation of the sign of H and L as signals propagate through the pipeline. As will be evident to those skilled in the art, this alternation may be accommodated by reversing the connection of the comparator U3 in each odd numbered instance of the pipeline (see FIG. 9 below, where the connection to U6 is opposite that of U3).

One amplifier U2 in a feedback configuration generates a new inverted value for the upper boundary H, while another amplifier U1 in a similar feedback configuration generates a new also inverted value for the lower boundary L. Amplifiers U1 and U2 are chosen to have the same time constant; determination of time constants is known in the art. A switch S4 connects alternately to the incoming value of H when in one position, and L when in the other position.

In circuit 700, it will be seen that when Bit is low and switch S4 connects to H, amplifier U2 receives H through both resistors leading to one of its inputs, while amplifier U1 receives H through one resistor and L through the other resistor leading to one of its inputs. The other input of each amplifier is connected to ground, since, as above, the circuit has been constructed to have the input signal be 0. Given the relative values of the resistors, this will result in Hout being the same as Hin, i.e., (Hin+Hin)/2, while Lout will now be (Hin+Lin)/2, other than the sign change described above.

Conversely, when Bit is high and switch S4 connects to L, amplifier U1 receives L through both resistors connected to one of its inputs, while amplifier U2 receives H through one resistor and L through the other resistor leading to one of its inputs. This will thus result in Lout being the same as Lin, while Hout will now be (Hin+Lin)/2, again other than the described sign change.

Figure 8:
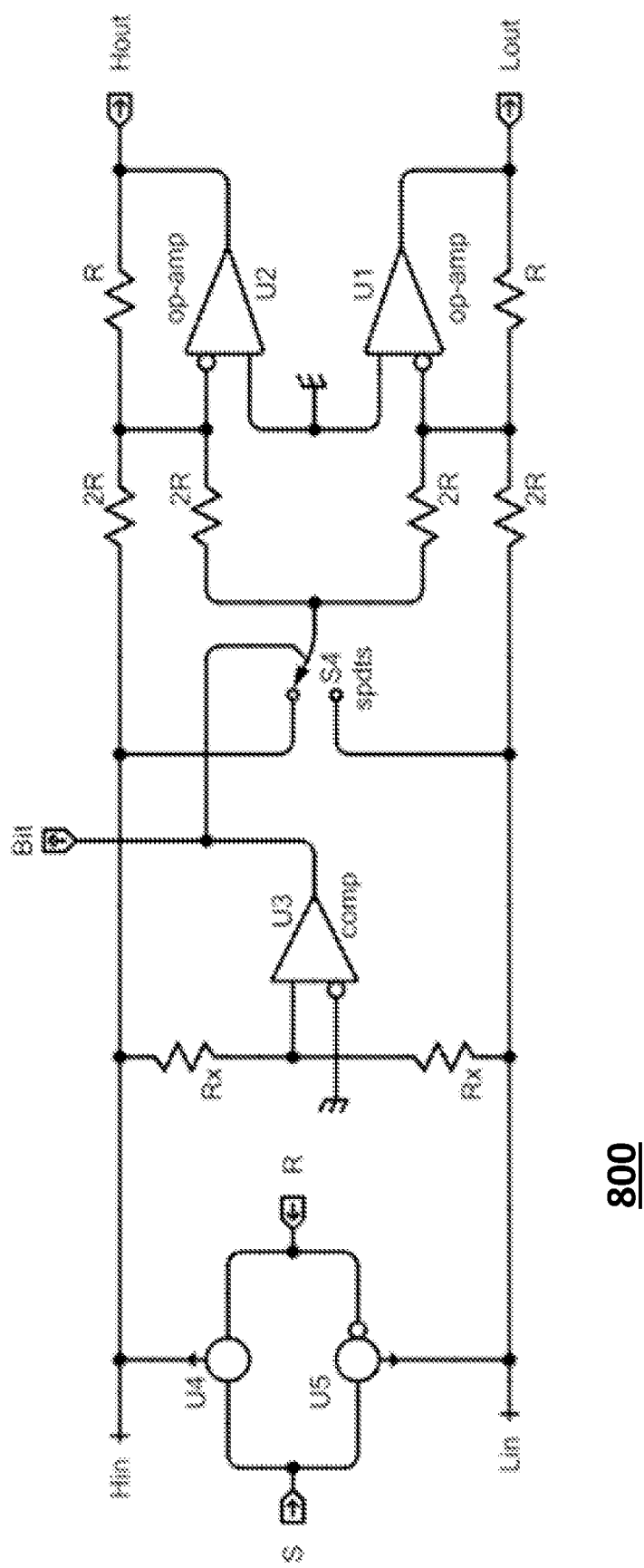
FIG. 8 is a diagram of another embodiment of a stage that may be used in a pipeline in the described method.

FIG. 8 is a diagram of one embodiment of a stage 800 that may be used in a pipeline in the described method and according to the present approach. Circuit 800 adds a means to input the signals S and R to circuit 700. The signals S and R are applied as inputs to two summers U4 and U5. Summer U4 adds S and R, and as above Hin=S+R; similarly, summer adds S and the inverse of R, and as above Lin=S−R.

When implemented, the outputs of circuit 700 or circuit 800 will be the inputs to the next stage. In addition, there will typically be two circuits such as circuit 700 of FIG. 7 (or two pipelines of such circuits) running in parallel so as to process a differential signal, one as illustrated, and another circuit of generally the same type that, instead of receiving H and L, receives $\overline{H}$ and $\overline{L}$ and thus produces new values of H and L, rather than new values of $\overline{H}$ and $\overline{L}$.

Figure 12:
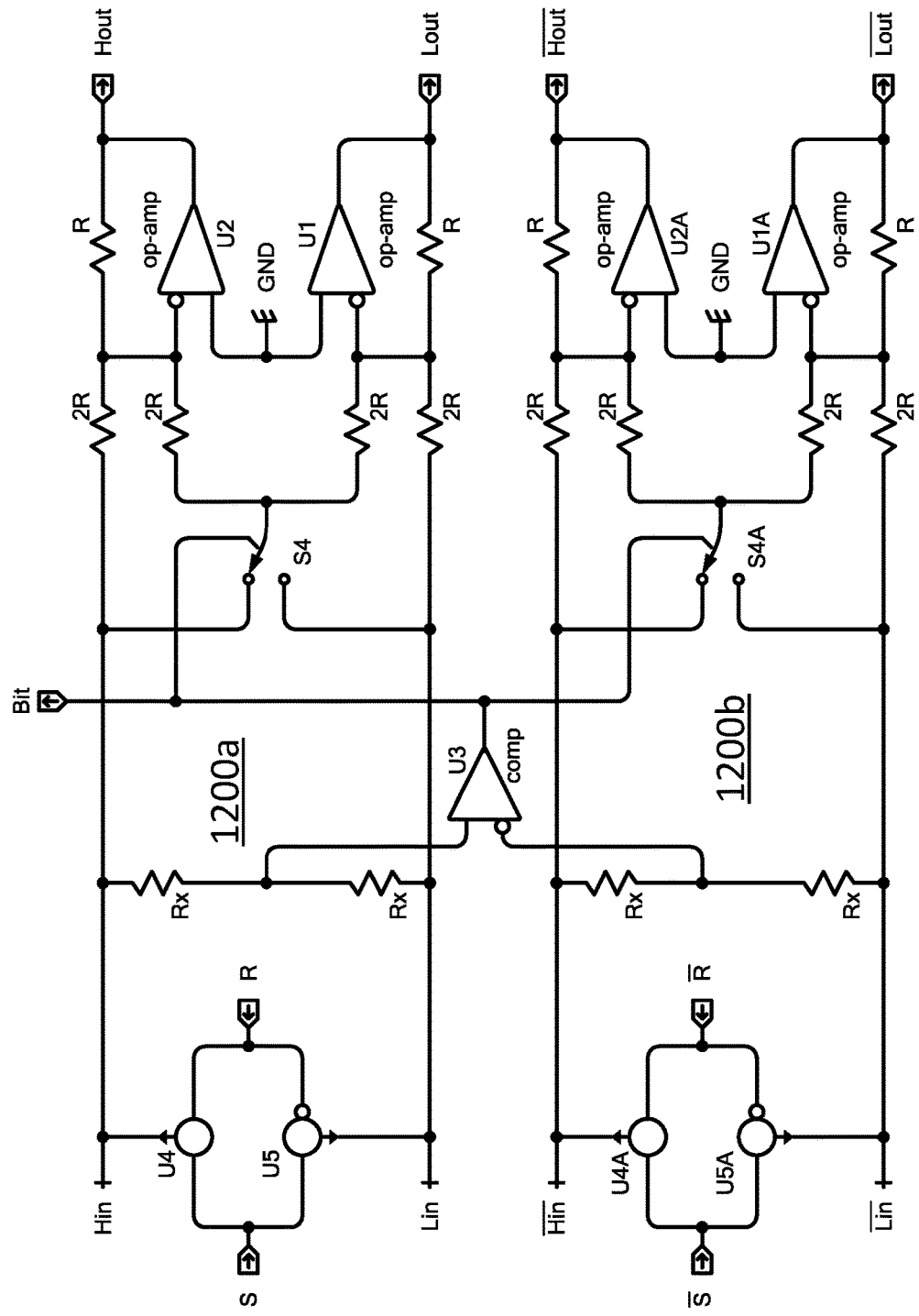
FIG. 12 is a diagram of a circuit 1200 for processing a differential signal according to one embodiment.

FIG. 12 is a diagram of a circuit 1200 for processing a differential signal according to one embodiment. There are now two instances of a sub-circuit, each of which is similar to circuit 800 of FIG. 8, an upper sub-circuit 1200a and a lower sub-circuit 1200b. The upper sub-circuit 1200a processes H and L generally as discussed above, while the lower sub-circuit 1200b processes $\overline{H}$ and $\overline{L}$. Lower sub-circuit generates $\overline{H}$ and $\overline{L}$ from $\overline{S}$ and $\overline{R}$, inverted values of S and R, in a similar fashion to how upper sub-circuit 1200a generates H and L from S and R as above.

The two sub-circuits now share a single comparator U3 rather than each circuit having a separate comparator, so that the comparator does not compare 0 (the adjusted input signal) to (H+L)/2, but rather compares (H+L)/2 to ($\overline{H}$+$\overline{L}$)/2. In such a case, the values of S and R will now be:

$$S = \frac{H+L-\overline{H}-\overline{L}}{2}$$

and $$R = H-L-\overline{H}+\overline{L}$$

The voltage range R is now twice as large, e.g., H−$\overline{H}$=2H.

Since H and L are passed down the pipeline, it may be seen that this technique is processing the boundaries of the search space, rather than the input signal itself. Eventually H and L will both approach the value of 0, if the circuit settles.

If the circuit doesn't settle, then both H and L are wrong; however, if the gain of the amplifiers matches, then the differences in value of H and L will match and the circuit will still provide an accurate output. One of skill in the art will also appreciate that the gain of amplifiers U1 and U2 may vary widely without affecting operation of the ADC. The accuracy is proportional to the accuracy of the gain matching, rather to the gain itself.

Figure 9:
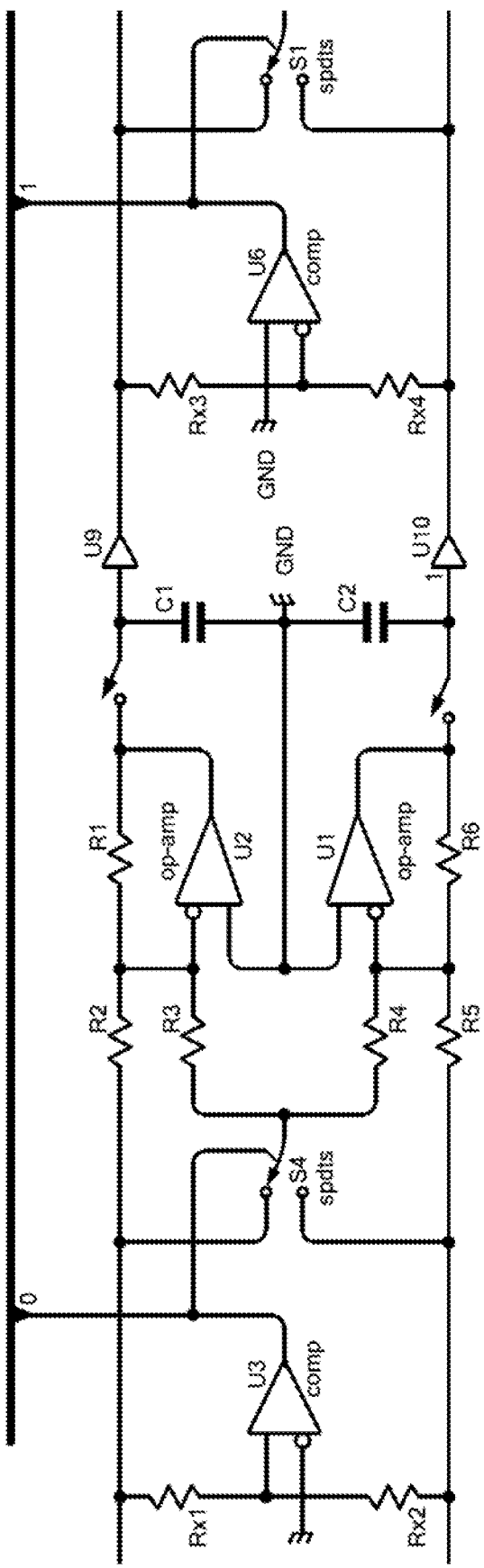
FIG. 9 is a diagram of still another embodiment of a stage that may be used in a pipeline in the described method.

FIG. 9 is a diagram of another embodiment of a stage 900 that may be used in a pipeline in the described method and according to the present approach. Circuit 900 illustrates how additional elements may be added to create a sample-and-hold function between stages of a pipeline, as is known in the art. (The input of S and R is not shown in FIG. 9.)

At the end of a first stage such as that shown in circuit 700 of FIG. 7, capacitors C1 and C2 are charged to sample the output of the first stage, i.e., the values of Hout and Lout, and hold them. Switches S5 and S6 are then opened, which allows the first stage to begin work on the next sample while the values of Hout and Lout are fed to the next stage, as seen in comparator U6 and switch S7. Elements U9 and U10 are preferably buffers of unity gain with high input impedance, located on the signal lines that promulgate H and L to prevent the charges on capacitors C1 and C2 from being inappropriately discharged through the resistors in the circuit.

As above, there are as many stages as desired to reach a particular accuracy of the overall output digital value. Each stage samples the output of the prior one, and, after the sample is taken, the prior stage moves on to the next sample. It will be apparent to one of skill in the art that the described method has a significant advantage, i.e., a sample need not wait for complete settling of the prior stage. The prior art would deem a sample that is taken "too soon" to be a fraction of what it "should" be, i.e., its full settled value. However, a circuit constructed according to the described method works if each sample is the same fraction of a full settled value.

In some instances, it is possible that the circuit will miss the correct value, resulting in a bit that is outside the allowed range. This might occur if some offset voltage is inadvertently received at the non-inverting input of comparator U3; if the signal is outside of the search space it is an error that cannot be recovered. However, such a problem can be countered by error correction.

One way to prevent this is by including some margin on the reduction of the search space boundaries H and L to allow for any imprecision in the comparator operation. For example, rather than reducing H or L by a factor of two, i.e. having a gain of 50% which reduces either H and L to half of its prior value in the appropriate circumstances as above, H and L might be reduced in each appropriate instance by, for example, a factor of 1.6, i.e., to 62.5% of their prior value. It will be apparent to one of skill in the art in light of the teachings herein halving the search space at each stage is a special case of a non-error corrected SAR ADC in which the bits from each comparison may be simply "dropped into" the equivalent bit in the output value. Thus, in the 8-bit example, the output is:

FirstBit*128+SecondBit*64+ThirdBit*32 . . . +LastBit*1 which may be written as:

FirstBit*FullScale+SecondBit*FullScale/2+ThirdBit*FullScale/4+ . . . +LastBit*FullScale/(2^7)

or simplified to an integral over the number of bits n of:

FullScale*$Cn/2^n$ where Cn is the comparator output bit of each of the n comparators in the pipeline.

It will further be apparent to one of skill in the art that in a case in which error correction is required, and the factor of search space reduction is less than 2 (1.6 is a common choice), less then one bit of output will be generated. In such a case the output will be given by a similar equation to that above but with a "radix" of less than two, i.e., the integral over a number n of:

FullScale*$Cn/1.6^n$

One of skill in the art will appreciate that this corresponds to how the comparator bits are processed to determine the digital output value. In some situations it may be desirable that different stages provide different amounts of gain.

Figure 10:
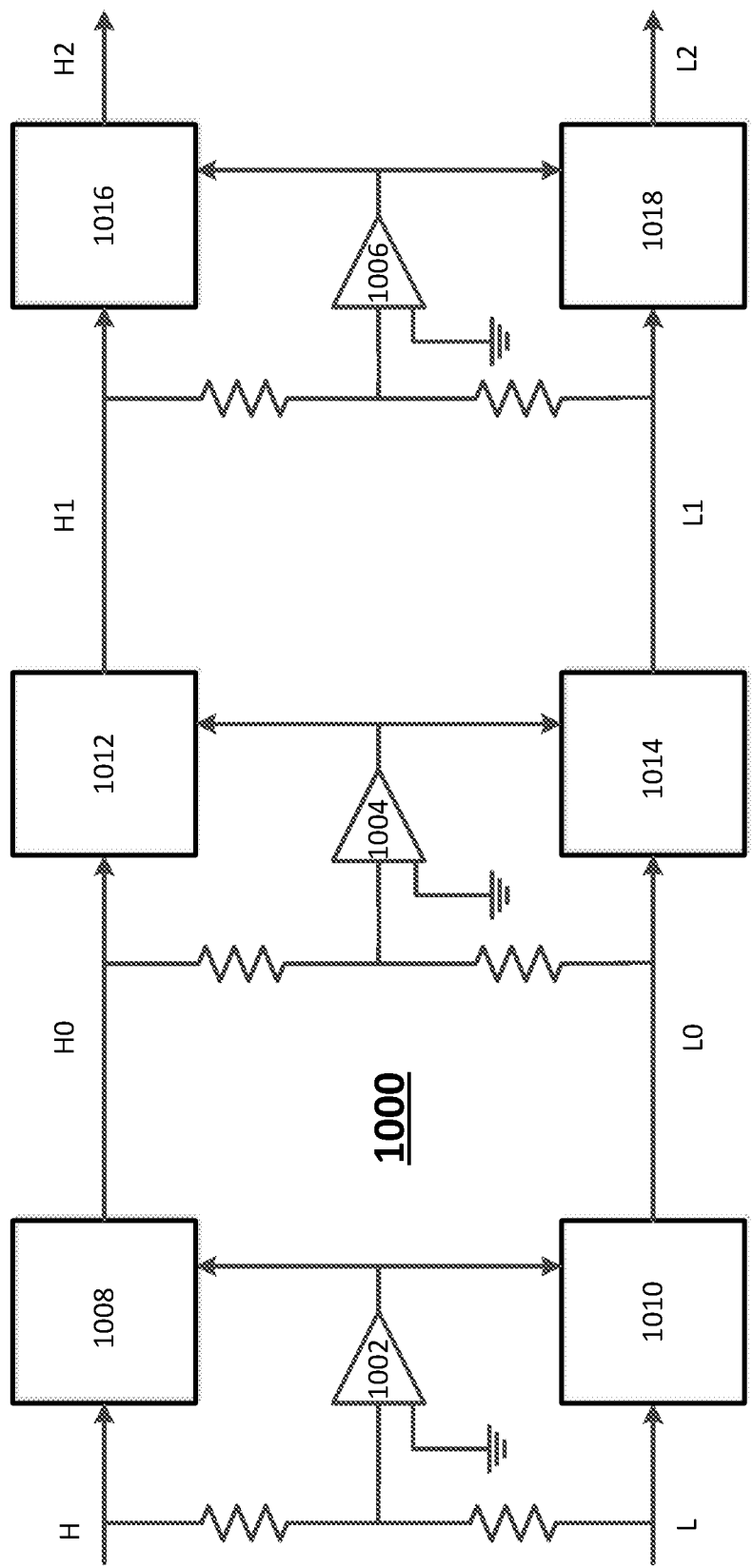
FIG. 10 is a block diagram of a pipeline that may be constructed from circuits such as those shown in FIG. 7, 8 or 9.

FIG. 10 is a block diagram of a pipeline that may be constructed from circuits such as that shown in FIG. 7. In a first stage, the average of H and L is compared to the input signal by amplifier 1002, which as above is redefined as 0. Based upon the result of the comparison, which is fed to elements 1008 and 1010, either H or L will be changed, resulting in new values of H and L, H0 and L0. The average of H0 and L0 is then again compared to 0 by amplifier 1004, and again elements 1012 and 1014 will change either H0 or L0, resulting in new values of H and L, H1 and L1. The process continues for as many stages, or bits, as necessary to obtain a desired accuracy. Elements 1008, 1010, etc. will normally be capacitors, as this allows each stage to perform a sample and hold operation. This allows for pipelining where the use of resistors would not. (The use of capacitors as enabling charge based signal processing is well known in the art.)

Figure 11:
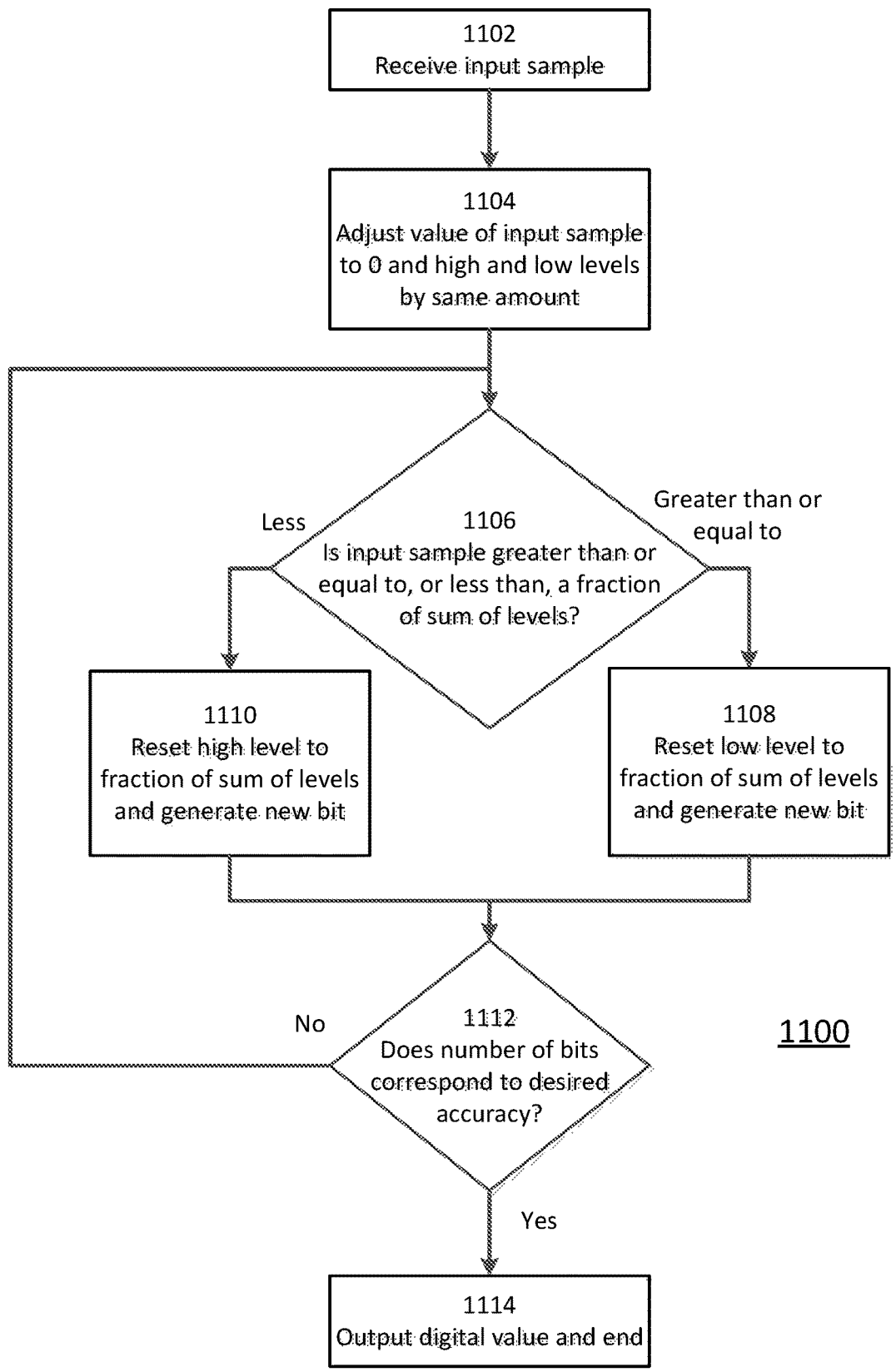
FIG. 11 is a flowchart of a method of generating a digital value from an analog sample according to one embodiment.

FIG. 11 is a flowchart of a method 1100 of generating a digital value from an analog sample according to one embodiment of the present approach. In this example, the values of H and L, the upper and lower levels of the search space, i.e., the possible range of the output digital value, are assumed to already be defined and available. In some embodiments, H and L may be predetermined by the size of the range R (as above, H=S+R and L=S−R), while in other embodiments the values of H and L may be input by a user.

At step 1102, a circuit of the present approach receives a sample of the analog input signal. As used herein, such a circuit includes any hardware, such as amplifiers, transistors, resistors and/or other electrical components, but may also be one or more processors, controllers, and/or other dedicated or programmable devices, capable of carrying out the operations described herein. The circuit performs the steps of the method 900.

At step 1104, used in some embodiments as described above, the circuit adjusts the value of the input sample to be 0, and increases or decreases each of the values of H and L by the same amount as the circuit has increased or decreased the input sample.

At step 1106, the circuit determines whether the input sample is greater than or equal to, or less than a fraction of the sum of H and L. As above, in some embodiments, this fraction is ½, but in other embodiments may be a different fraction, such as ⅝, to allow for situations where the generated bit would otherwise fall outside of the allowed range. As described above, in some embodiments this is accomplished by the use of an amplifier, such as amplifier U1 and U2 in FIG. 7, with an appropriate resistive network for receiving the input signal and a feedback loop.

If the input sample is greater than or equal to the fraction of the sum of H and L, at step 1108 the circuit resets the value of L to be the fraction of the sum of H and L, while leaving the value of H unchanged, and generates a 1 or 0 as the first (or next as described below) bit of the output digital value.

On the other hand, if the input sample is less than the fraction of the sum of H and L, at step 1110 the circuit resets the value of H to be the fraction of the sum of H and L, while leaving the value of L unchanged, and generates a 0 or 1 as the first (or next as described below) bit of the output digital value. Again, in the example above, the operation of amplifiers 702 and 704 with the resistive networks and inputs shown will operate to reset either H or L for a given input sample.

After either step 1108 or step 1110, at step 1112 the circuit determines whether the number of bits generated for the digital value representing the input sample corresponds to a desired level of accuracy, i.e., 8 bits corresponds to one part in 256, 10 bits to one part in 1024, etc. Again the number of bits of desired accuracy is here assumed to be defined and available. In some embodiments the number of bits may be predetermined; if circuits such as those shown in FIGS. 7 and 8 above are used, the number of desired bits is defined by the number of stages in the pipeline.

In other embodiments, for example those using programmable devices, the number of desired bits, i.e., the desired level of accuracy, is presumably an input. The processor can compare the number of bits generated to the number of desired bits and stop when the process produces the desired number of bits.

If it is determined in step 1112 that the number of bits corresponds to the desired level of accuracy, at step 1114 the circuit outputs the digital value representing the analog sample and ends the process for that sample. Where circuits such as those shown in FIGS. 7 and 8 are used, the output of the last stage is the digital value representing the input analog signal.

Conversely, if it is determined in step 1112 that the number of bits does not correspond to the desired level of accuracy, the circuit returns to step 1106, and the comparison of the input sample to the fraction of the sum of H and L is again made, but with either H or L having now been adjusted in steps 1108 or 1110. Where circuits such as those shown in FIGS. 7 and 8 are used, this is done by passing the values of H and L, one of which has now been adjusted in step 1108 or 1110, to a next stage.

While the above description illustrates a hardware implementation of the described present approach, in some instances it may be desirable to implement the technique on a processor or other programmable device. The Appendix hereto provides examples of computer code in the LISP programming language that may be used to implement the approach described herein.

According to the present approach a pipelined ADC can be either be run faster or use significantly less power. For example, a typical pipelined ADC running at a speed of 1 GHz may use 170 milliamps (mA) of power. A pipelined ADC using the approach described herein can run at about 5 GHz, five times faster, or, alternatively, run at 1 GHz will using about ⅕ the power, or about 34 mA.

One of skill in the art will appreciate that additions and/or modifications to the approach described herein are possible. For example, techniques or features such as grey code encoding, and input of differential signals are known in the art; from the teachings herein, one of skill in the art will be able to include such techniques in the present approach if desirable or appropriate for a particular situation.

One of skill in the art will also appreciate how the LISP code in the Appendix may be altered or augmented to include some of the other possible features described above, or how to write code in a different programming language that accomplishes the described technique.

By combining these features, it is possible to construct a pipelined ADC that will run significantly faster at a given power and bandwidth than conventional pipelined ADCs of the prior art. One of skill in the art will appreciate that a pipelined ADC having any desired number of bits of accuracy may be constructed according to these principles.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of transistors and the associated feedback loops, resistors, etc., is exemplary; one of skill in the art will be able to select the appropriate number of transistors and related elements that is appropriate for a particular application.

It should also be appreciated that the described method and apparatus can be implemented in numerous ways, including as a process, an apparatus, or a system. The methods described herein may be implemented by program instructions for instructing a processor to perform such methods, and such instructions recorded on a non-transitory computer readable storage medium such as a hard disk drive, floppy disk, optical disc such as a compact disc (CD) or digital versatile disc (DVD), flash memory, etc. The methods may also be incorporated into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

APPENDIX

If a signal S is imposed on H and L, the upper and lower boundary of the search space, such that H=S+R and L=S−R where R is some range, then a pipeline stage that implements the following LISP code:
H<=g (if (plusp (+H L)) (+H H) (+H L))
L<=g (if (plusp (+H L)) (+H L) (+L L))
operates without dependency on 'g', an arbitrary gain in the circuit.

For example, this code to create the next H and L given the current H and L creates a linear ADC. It is the above equations, where g is nominally 0.5, written out in LISP code:
(defun cell (H L)
  (if (>(+H L) 0)
  (values (*0.5 (+H L)) L)
  (values H (*0.5 (+H L)))))

The above code represents a cell that has two inputs H and L and two outputs: a new H' output and a new L' output. These signals H and L as they pass down the pipeline replace the known art signal and residue that passes down the pipeline. (The code definition of 'cell' is using g=0.5.)

Many modifications are possible to the code. For example, the following modification introduces a parameter 'A' which allows error correction as the pipeline proceeds. The locally defined function 'stage' shows the gain factor (g above) as 'G' and a new factor 'A' is introduced. This code consequently generalizes the operation leaving room for an error in the determination of (H+L)>0.

---

```
(defun error-correct-adc-rms-error (&key (N 16) (err 0)
                                         (HL 200m) (A 0.9) (G 0.8))
    (flet ((stage
              (h l)
              (if (> (+ err (* 0.5 (+ h l))) 0)
                  (values 1 (* G (+ h (* A l))) (* G (+ l
                      (* A l))))
                  (values -1 (* G (+ h (* A h))) (* G (+ l
                      (* A h)))))))
        (loop
            for s from (- HL) to HL by (/ HL 1000)
            collect
            (loop
                repeat N
                with w = 1
                with h = (+ s HL)
                with l = (- s HL)
                with b = 0
                do (multiple-value-setq (b h l) (stage h 1))
                sum (* b (setq w (* (/ 1 (+ 1 A)) w))))
            into y
            finally (return (rms-deviation-from-line y)))))
```

---

The search space is now not reduced by a factor of two (that would be one exact mathematical bit) but by a smaller factor, the parameter 'A'. The ADC nevertheless still operates.

However, a distinct discontinuity in the value of H and L occurs at the "breakpoint" induced by the comparison operation. For example, H just below the comparator trip point goes to 2H, but just above goes to H+L. This means that the electronic circuit may erroneously start to converge on, for example, the 2H value only to slightly later have to slew back to the H+L value, due to delay in the comparison operation.

This code example removes that discontinuity:

```
(defun error-correct-greycode-adc-rms-error (&key (N 16) (err 0)
                                              (HL 200m) (A 0.9) (G 0.8))
  (flet ((stage
             (h l)
             (if (> (+ err (* 0.5 (+ h l))) 0)
                 (values 1 (* -1 G (+ l (* A l))) (* -1 G (+ h (* A l))))
                 (values -1 (* G (+ h (* A h))) (* G (+ l (* A h)))))))
    (loop
       for s from (- HL) to HL by (/ HL 1000)
       collect
       (loop
          repeat N
          with w = 1
          with h = (+ s HL)
          with l = (- s HL)
          with b = -1
          with bx
          do
          (multiple-value-setq (bx h l) (stage h l))
          (setq b (* -1 bx b))
          sum (* b (setq w (* (/ 1 (+ 1 A)) w))))
       into y
       finally
       '(plot y)
       (return (rms-deviation-from-line y)))))
```

Despite the change to this "grey-code" example, the error toleration remains.

What is claimed is:

1. A method of converting an input sample of an analog signal to a digital value, comprising:
   receiving, by a circuit, the input sample of an analog signal;
   determining, by the circuit, that a value based upon the input sample is either greater than or equal to, or less than, a fraction of the sum of a high level and a low level and generating a bit of 1 or 0 if the value based upon the input sample is greater than or equal to the fraction of the sum of the high level plus the low level or an opposite bit of 0 or 1 if the value based upon the input sample is less than the fraction of the sum of the high level and the low level;
   resetting, by the circuit, the low level to the fraction of the sum of the high level plus the low level without altering the high level if the value based upon the input sample is greater than or equal to the fraction of the sum of the high level and the low level;
   resetting, by the circuit, the high level to the fraction of the sum of the high level plus the low level without altering the low level if the value based upon of the input sample is less than the fraction of the sum of the high level plus the low level; and
   repeating the steps of comparing the value based upon the input sample to the fraction of the high level plus the low level and resetting the high or low level and attaching additional bits generated by each comparing step to bits previously generated until a number of bits corresponding to a desired accuracy of the digital value have been generated.

2. The method of claim 1 wherein the value based upon the input sample is the same as the input sample.

3. The method of claim 1 wherein the fraction is one-half.

4. The method of claim 1 wherein the fraction is greater than one-half.

5. The method of claim 1 further comprising, before the step of determining that the input sample is either greater than or equal to; or less than, a fraction of the sum of the high level plus the low level, adjusting, by the circuit, the value of the input sample up or down by an amount necessary so that the value of the input sample is zero, and adjusting the high level and low level up or down by the same amount as the input sample was adjusted.

6. The method of claim 1 wherein the bit generated when the input sample is greater than or equal to a fraction of the sum of a high level and a low level is 0 and the bit generated when the input sample is less than a fraction of the sum of a high level and a low level is 1.

7. The method of claim 1 further comprising receiving, by the circuit, a value indicating a range along with the input sample and generating the high level as the sum of the input sample and the range, and the low level as the difference of the input sample and the range.

8. The method of claim 1 wherein the analog signal is a differential signal comprising the input sample and its inverse, wherein the value based upon the input sample is a fraction of the sum of the inverse of the high level plus the inverse of the low level, and further comprising:
   receiving, by the circuit, the inverse of the input sample;
   resetting, by the circuit, the inverse of the low level to the fraction of the sum of the inverse of the high level plus the inverse of the low level without altering the inverse of the high level if the value of the value based upon the input sample is greater than or equal to the fraction of the sum of the high level plus the low level;
   resetting, by the circuit, the inverse of the high level to the fraction of the sum of the inverse of the high level plus the inverse of the low level without altering the inverse of the low level if the value of the value upon the input sample is less than the fraction of the sum of the high level plus the low level; and
   repeating the steps of comparing the value based upon the input sample to the fraction of the high level plus the low level of and resetting the inverse of the high level or the inverse of the low level and attaching additional bits generated by each comparing step to bits previously generated until a number of hits corresponding to a desired accuracy of the digital value have been generated.

9. A circuit for use as a stage in an analog to digital converter, comprising:
- a comparator configured to compare an input sample of an analog signal, to a fraction of the sum of high level and a low level, and to generate a bit of 1 or 0 if the input sample is greater than or equal to the fraction of the sum of high level and the low level or an opposite bit of 0 or 1 if the input sample is less than the fraction of the sum of the high level and the low level;
- a first amplifier circuit configured to output as the low level the fraction of the sum of the high level plus the low level without altering the high level if the value of the input sample is greater than or equal to the fraction of the sum of the high level and the low level; and
- a second amplifier circuit configured to output as the high level the fraction of the sum of the high level plus the low level without altering the low level if the value of the input sample is less than the fraction of the sum of the high level plus the low level.

10. The circuit of claim 9 further comprising a first summer configured to receive the input sample and a signal representing a range, and to output the sum of the input sample and the range as the high level.

11. The circuit of claim 10 further comprising a second summer configured to receive the input sample and the signal representing a range, and to output the difference of the input sample and the range as the low level.

12. The circuit of claim 9 further comprising a sample and hold circuit for storing the values of the high level and low level output by the first and second amplifier circuits, comprising:
- a first capacitor having a first end coupled to a ground, and a second end;
- a first switch having a first end coupled to the output of the first amplifier and a second end coupled to the second end of the first capacitor, the first switch configured to connect the first capacitor to the output of the first amplifier when the first switch is in a first position and to disconnect the first capacitor from the output of the first amplifier when the first switch is in a second position; and
- a second capacitor having a first end coupled to a ground, and a second end;
- a second switch having a first end coupled to the output of the second amplifier and a second end coupled to the second end of the second capacitor, the second switch configured to connect the second capacitor to the output of the second amplifier when the second switch is in a first position and to disconnect the second capacitor from the output of the second amplifier when the second switch is in a second position.

13. A non-transitory computer readable storage medium having embodied thereon instructions for causing a computing device to execute a method of converting an input sample of an analog signal to a digital value, the method comprising:
- receiving, by a processor, the input sample of an analog signal;
- determining, by the processor, that the input sample is either greater than or equal to, or less than, a fraction of the sum of a high level and a low level and generating a bit of 1 or 0 if the input sample is greater than or equal to the fraction of the sum of high level and the low level or an opposite bit of 0 or 1 if the input sample is less than the fraction of the sum of the high level and the low level;
- resetting, by the processor, the low level to the fraction of the sum of the high level plus the low level without altering the high level if the value of the input sample is greater than or equal to the fraction of the sum of the high level and the low level;
- resetting, by the processor, the high level to the fraction of the sum of the high level plus the low level without altering the low level if the value of the input sample is less than the fraction of the sum of the high level plus the low level; and
- repeating the steps of comparing the input sample to the fraction of the high level and low level of and resetting the high or low level and attaching additional bits generated by each comparing step to bits previously generated until a number of bits corresponding to a desired accuracy of the digital value have been generated.

* * * * *